United States Patent
Yuasa et al.

(10) Patent No.: US 10,919,811 B2
(45) Date of Patent: Feb. 16, 2021

(54) ALUMINUM-SILICON-CARBIDE COMPOSITE AND METHOD OF MANUFACTURING SAME

(71) Applicant: Denka Company Limited, Tokyo (JP)

(72) Inventors: Akimasa Yuasa, Omuta (JP); Takeshi Miyakawa, Omuta (JP); Daisuke Goto, Omuta (JP)

(73) Assignee: Denka Company Limited, Tokyo (JP)

( * ) Notice: Subject to any disclaimer, the term of this patent is extended or adjusted under 35 U.S.C. 154(b) by 369 days.

(21) Appl. No.: 15/748,420

(22) PCT Filed: Jul. 31, 2015

(86) PCT No.: PCT/JP2015/071802
§ 371 (c)(1),
(2) Date: Jan. 29, 2018

(87) PCT Pub. No.: WO2017/022012
PCT Pub. Date: Feb. 9, 2017

(65) Prior Publication Data
US 2018/0215668 A1    Aug. 2, 2018

(51) Int. Cl.
| | | |
|---|---|---|
| B22F 3/26 | (2006.01) | |
| C04B 35/565 | (2006.01) | |
| C04B 41/88 | (2006.01) | |
| C04B 38/00 | (2006.01) | |
| B22D 19/00 | (2006.01) | |
| C04B 41/00 | (2006.01) | |
| C04B 41/51 | (2006.01) | |
| B22D 19/02 | (2006.01) | |
| C04B 35/573 | (2006.01) | |
| C04B 35/63 | (2006.01) | |
| H01L 23/373 | (2006.01) | |
| H01L 21/48 | (2006.01) | |
| C04B 35/645 | (2006.01) | |
| B22D 19/14 | (2006.01) | |
| C22C 1/10 | (2006.01) | |
| C04B 111/00 | (2006.01) | |

(52) U.S. Cl.
CPC ............ *C04B 35/565* (2013.01); *B22D 19/00* (2013.01); *B22D 19/02* (2013.01); *B22D 19/14* (2013.01); *C04B 35/573* (2013.01); *C04B 35/6316* (2013.01); *C04B 35/645* (2013.01); *C04B 38/00* (2013.01); *C04B 38/0032* (2013.01); *C04B 41/009* (2013.01); *C04B 41/5155* (2013.01); *C04B 41/88* (2013.01); *C22C 1/1068* (2013.01); *H01L 21/4871* (2013.01); *H01L 23/3731* (2013.01); *H01L 23/3736* (2013.01); *C04B 2111/00844* (2013.01); *C04B 2111/00931* (2013.01); *C04B 2235/3418* (2013.01); *C04B 2235/3826* (2013.01); *C04B 2235/401* (2013.01); *C04B 2235/402* (2013.01); *C04B 2235/428* (2013.01); *C04B 2235/5472* (2013.01); *C04B 2235/6027* (2013.01); *C04B 2235/616* (2013.01); *C04B 2235/783* (2013.01); *C04B 2235/786* (2013.01); *C04B 2235/9607* (2013.01); *C22C 1/10* (2013.01); *C22C 1/1036* (2013.01); *C22C 2001/1021* (2013.01); *Y10T 428/12007* (2015.01)

(58) Field of Classification Search
None
See application file for complete search history.

(56) References Cited

U.S. PATENT DOCUMENTS

| | | | |
|---|---|---|---|
| 2009/0075056 A1 | 3/2009 | Iwamoto et al. | |
| 2011/0316040 A1 | 12/2011 | Hirotsuru et al. | |
| 2012/0165179 A1* | 6/2012 | Reilly | C04B 41/009 501/88 |
| 2014/0271318 A1* | 9/2014 | Zheng | B23K 35/3033 419/7 |
| 2015/0218005 A1* | 8/2015 | Kim | C04B 35/565 428/402 |

FOREIGN PATENT DOCUMENTS

| | | | |
|---|---|---|---|
| JP | 2000-141022 A | 5/2000 | |
| JP | 2000-154080 A | 6/2000 | |
| JP | 2000-169267 A | 6/2000 | |
| JP | 2010-278171 A | 12/2010 | |
| JP | 2014-107468 A | 6/2014 | |
| WO | WO 2007/129715 A1 | 11/2007 | |
| WO | WO 2010/092972 A1 | 8/2010 | |

* cited by examiner

*Primary Examiner* — Seth Dumbris
(74) *Attorney, Agent, or Firm* — Foley & Lardner LLP

(57) ABSTRACT

Provided are an aluminum-silicon-carbide composite having high thermal conductivity, low thermal expansion, and low specific gravity and a method for producing the composite. Provided is an aluminum-silicon-carbide composite formed by impregnating a porous silicon carbide molded body with an aluminum alloy. The ratio of silicon carbide in the composite is 60 vol % or more, and the composite contains 60-75 mass % of silicon carbide having a particle diameter of 80 μm or more and 800 μm or less, 20-30 mass % of silicon carbide having a particle diameter of 8 μm or more and less than 80 μm, and 5-10 mass % of silicon carbide having a particle diameter of less than 8 μm.

4 Claims, No Drawings

ALUMINUM-SILICON-CARBIDE COMPOSITE AND METHOD OF MANUFACTURING SAME

CROSS-REFERENCE TO RELATED APPLICATIONS

This application is a National Stage application of PCT/JP2015/071802, filed Jul. 31, 2015.

TECHNICAL FIELD

The present invention relates to an aluminum-silicon-carbide composite and a method of manufacturing same.

BACKGROUND ART

Conventionally, copper has been used as a heat sink material in a power module. However, when copper is used as a heat sink material, its high coefficient of thermal expansion (17 ppm/K) causes a problem in reliability, such as cracks occurring in the ceramic circuit board mounted on the heat sink material or in the solder joining the heat sink material and the ceramic circuit board. Accordingly, there has been demand for a heat sink material having low thermal expansion and high thermal conductivity.

Under the above-described circumstance, silicon carbide composites have recently attracted attention as a heat sink material, because, for example, the composites can decrease their coefficients of thermal expansion to 10 ppm/K or less by increasing the contents of silicon carbide in the composites, high thermal conductivity can be achieved, and further, the specific gravity is low (Patent Documents 1, 2, and 3).

However, the thermal conductivity of conventional silicon carbide composites are each about 200 W/mK at most at room temperature and are significantly lower than that (400 W/mK) of copper, and there has been demand for a silicon carbide composite having a further high thermal conductivity.

The present inventors diligently studied how the problems with conventional heat sink materials can be solved, and as a result, found that the thermal conductivity of a silicon carbide composite highly depends on the particle diameter of the silicon carbide particles constituting the composite and the content of silicon carbide, that a composite having a particle diameter and silicon carbide content within specific ranges has a high thermal conductivity of 230 W/mK or more, that the mere use of a silicon carbide powder having a large particle diameter cannot increase the silicon carbide content in the composite and cannot achieve a high thermal conductivity of 230 W/mK or more, and also that when adding a silicon carbide fine powder for the purpose of increasing the silicon carbide content, the particle diameter and the amount of the silicon carbide particles to be used should be specified in order to achieve a high thermal conductivity of 230 W/mK or more, and arrived at the present invention.

Patent Document 1: JP 2000-154080 A
Patent Document 2: JP 2000-141022 A
Patent Document 3: JP 2000-169267 A

SUMMARY OF THE INVENTION

The present invention was made in the light of the above-described circumstances and was made in order to obtain an aluminum-silicon-carbide composite having high thermal conductivity, low thermal expansion, and low specific gravity.

The aluminum-silicon-carbide composite according to the present invention is formed by impregnating a porous silicon carbide molded body with an aluminum alloy. The ratio of silicon carbide in the composite is 60 vol % or more, and the composite contains 60-75 mass % of silicon carbide having a particle diameter of 80-800 µm, 20-30 mass % of silicon carbide having a particle diameter of 8 µm or more and less than 80 µm, and 5-10 mass % of silicon carbide having a particle diameter of less than 8 µm.

According to an aspect of the present invention, the aluminum-silicon-carbide composite has a thermal conductivity of 230 W/mK or more at 25° C.

According to an aspect of the present invention, the aluminum-silicon-carbide composite has a coefficient of thermal expansion of 7.0 ppm/K or less at 25° C. to150° C.

According to an aspect of the present invention, the aluminum alloy in the aluminum-silicon-carbide composite contains 10-14 mass % of silicon and 0.5-2.5 mass % of magnesium.

According to an aspect of the present invention, the aluminum-silicon-carbide composite is prepared by adding an inorganic binder to a raw material powder including three or more silicon carbide powders having different particle size distributions and performing a molding step and a firing step.

The aluminum-silicon-carbide composite according to the present invention or the aluminum-silicon-carbide composite provided by the production method according to the present invention has high thermal conductivity, low thermal expansion, and low specific gravity.

MODES FOR CARRYING OUT THE INVENTION

Regarding the aluminum-silicon-carbide composite and the method for producing the composite according to the present invention, an embodiment will now be described. It is, however, obvious that the present invention is not limited to the following embodiment.

The aluminum-silicon-carbide composite according to the embodiment is formed by impregnating a porous silicon carbide molded body with an aluminum alloy. The ratio of silicon carbide in the composite is 60 vol % or more, and the composite contains 60-75 mass % of silicon carbide having a particle diameter of 80-800 µm, 20-30 mass % of silicon carbide having a particle diameter of 8 µm or more and less than 80 µm, and 5-10 mass % of silicon carbide having a particle diameter of less than 8 µm. In the embodiment, the particle diameter of silicon carbide means the particle diameter calculated by an electric resistance testing method.

[Silicon Carbide Composite]

The aluminum-silicon-carbide composite according to the embodiment can have a thermal conductivity of 230 W/mK or more by adjusting the amount of particles having a particle diameter of 80-800 µm to 60 mass % or more and less than 75 mass % based on the total amount of silicon carbide particles.

The target thermal conductivity, 230 W/mK or more, can be readily achieved by adjusting the particle diameter to 80 µm or more, but the purpose of the present invention cannot be achieved if the amount of the particles having the above-mentioned particle diameter is less than 55 mass %, even if the silicon carbide content itself in the composite can be increased.

In the aluminum-silicon-carbide composite according to the embodiment, the effect of suppressing the decrease in thermal conductivity can be obtained by adjusting the amount of particles having a particle diameter of 8 μm or more and less than 80 μm to 20 mass % or more and less than 30 mass % based on the total amount of silicon carbide particles.

In the aluminum-silicon-carbide composite according to the embodiment, the target coefficient of thermal expansion, 7.0 ppm/K or less, can be readily achieved by adjusting the amount of particles having a particle diameter of less than 8 μm to 5 mass % or more and less than 10 mass % based on the total amount of silicon carbide particles.

The aluminum-silicon-carbide composite according to the embodiment is based on the findings that the particle diameter of the silicon carbide particles constituting the composite and the silicon carbide content are important factors highly affecting the thermal conductivity and that a silicon carbide composite having a high thermal conductivity of 230 W/mK or more at room temperature (25° C.) can be obtained when the silicon carbide particles have a particle diameter within a specific range and the silicon carbide content in the composite is a predetermined level or more.

In the silicon carbide composite prepared by merely using a silicon carbide powder having a large particle diameter, since the particle diameter of the used silicon carbide particle itself is large, oxygen contamination from the raw materials is small. In addition, since oxygen contamination due to influence of, for example, oxidation is hardly caused throughout the process of producing the composite, the silicon carbide composite has a relatively high thermal conductivity, but it is difficult to achieve a high thermal conductivity of 230 W/mK or more. The reasons thereof are based on the findings that an increase of the silicon carbide content in the composite is difficult due to the large particle diameter and also that the amount of a silicon carbide powder having a small particle diameter to be added for increasing the silicon carbide content should be limited within a specific range in order to achieve a high thermal conductivity of 230 W/mK or more at room temperature.

[Aluminum Alloy]

In the embodiment, examples of the aluminum alloy include an aluminum alloy containing silicon, an aluminum alloy containing silicon and magnesium, and an aluminum alloy containing magnesium that are usually used in production of silicon carbide composites. Among these aluminum alloys, an aluminum alloy containing silicon and magnesium is preferred due to the low melting point of the molten metal and good workability, and an aluminum alloy containing magnesium is preferably selected from the viewpoint of improving the thermal conductivity of the resulting composite.

In order to prevent a decrease in thermal conductivity, the content of silicon is preferably 18 mass % or less and more preferably 10 to 14 mass %.

The content of magnesium is preferably 0.5-2.5 mass % considering, for example, that the melting point of the alloy is decreased to provide good workability and that a decrease in the thermal conductivity of the resulting composite is caused.

Furthermore, a content of 0.5-1.6 mass % provides a thermal conductivity of 230 W/mK or more at 25° C., and a content of 1.6-2.5 mass % provides a thermal conductivity of 240 W/mK or more at 25° C. and is thus more preferred.

The application of the aluminum-silicon-carbide composite according to the embodiment is not limited, but in an application particularly demanding a further low thermal expansion property, as in a semiconductor module radiator plate, a high content of silicon carbide in the composite is desirable. Accordingly, the silicon carbide content in the composite is preferably 60 vol % or more. In this case, a composite having a coefficient of thermal expansion of 7.0 ppm/K or less at 25° C. to 150° C. can be obtained.

[Production Method]

The aluminum-silicon-carbide composite according to the embodiment may be produced by using a silicon carbide powder constituted such that the content of particles having a particle diameter of 80-800 μm is 60-75 mass %, the content of particles having a particle diameter of 8 μm or more and less than 80 μm is 20-30 mass %, and the content of particles having a particle diameter of less than 8 μm is 5-10 mass % in the whole silicon carbide particles, preparing a porous molded body having a filling degree (or relative density) of silicon carbide of 60 vol % or more, and impregnating the porous molded body with an aluminum alloy by applying a known impregnation method.

The known impregnation method is, for example, a method in which a predetermined amount of a silicon carbide powder is input into a molten aluminum alloy while stirring, a powder-metallurgical method in which a silicon carbide powder and an aluminum alloy powder are mixed and fired, and a molten metal forging method or a die casting method in which a preform composed of silicon carbide is produced in advance and the preform is impregnated with a molten aluminum alloy. Among these methods, a preferred method is the method including production of a preform and impregnation of the preform with molten aluminum from the viewpoint of being capable of increasing the silicon carbide content in the composite and readily obtaining a dense composite.

A more preferred impregnation method is the molten metal forging method. In this method, a preform is set in a mold, and an aluminum alloy is input thereinto, followed by compression by a mechanical pressure. The process is simple, and, for example, when the preheating of the preform, is performed in air, impregnation with an aluminum alloy can be performed under temperature conditions inhibiting the preform from being highly oxidized by the preheating. The general conditions in the molten metal forging method are a temperature of a molten aluminum alloy of 700° C. to 850° C. during the impregnation with the aluminum alloy and a pressure of 30 MPa or more during the impregnation.

The present invention will now be described in more detail through, in particular, a method in which a preform is impregnated with an aluminum alloy, as a method for producing the aluminum-silicon-carbide composite according to the embodiment.

In the production of a preform, a known molding method, such as a press molding method, a cast molding method, and an extrusion molding method, can be employed as the method for molding the preform, and known treatments, such as drying and firing, can be applied. In the molding, there is no problem in using an organic binder, such as methyl cellulose and PVA, an inorganic binder, such as colloidal silica and alumina sol, and a solvent, such as water and an organic solvent.

Such a variety of treatment may be performed as long as the preform immediately before the impregnation is constituted such that the content of particles having a particle diameter of 80-800 μm is 60-75 mass %, the content of particles having a particle diameter of 8 μm or more and less than 80 μm is 20-30 mass %, and the content of particles having a particle diameter of less than 8 μm is 5-10 mass % in the whole silicon carbide particles and maintains a filling degree of silicon carbide of 60 vol % or more.

In order for the preform to express the strength thereof, the addition of inorganic binder such as colloidal silica and alumina sol to the preform is carried out, but these binders function for decreasing the thermal conductivity. Accordingly, in the addition, the amount of the inorganic binder should be appropriately controlled in accordance with the particle diameter of the silicon carbide powder to be used in the production of a preform and the filling degree of silicon carbide of the resulting preform. Among the inorganic binders, colloidal silica is preferred because it becomes silica by being fired and binds to silicon carbide particles to express sufficient preform strength. However, since the addition of such an inorganic binder causes an increase in oxygen amount derived from the inorganic binder, the addition amount of the inorganic binder should be restricted.

In the production of the aluminum-silicon-carbide composite according to the embodiment, for example, in the case of silica sol having a solid content concentration of 20 mass %, the addition amount of the inorganic binder is preferably 10 mass % or less based on the total amount of silicon carbide particles. When the addition amount of the inorganic binder is 10 mass % or more, the thermal conductivity at 25° C. is 230 W/mK or more, and when the amount is 10 mass % or more, the thermal conductivity at 25° C. is 245 W/mK or more.

The preform is usually fired in order to, for example, express the strength by the inorganic binder. On this occasion, usually, the firing is performed in an oxygen-containing atmosphere, such as in air, and the silicon carbide powder constituting the preform is slightly oxidized by the firing, which may cause a decrease in the thermal conductivity of the composite. Accordingly, in the firing of the preform, conditions that are insusceptible to oxidation should be employed as much as possible according to the particle diameter of the silicon carbide powder to be used. For example, the firing in air is preferably performed at a temperature of less than 950° C., which varies depending on the retention time, to suppress oxidation as much as possible. A preferred temperature range is 750° C. to 900° C. Examples of the firing method in a non-oxidizing atmosphere include firing methods in a non-oxidizing gas, such as argon, helium, hydrogen, and nitrogen, or in vacuum.

The preform can be impregnated with an aluminum alloy by a known method, such as a molten metal forging method, a die casting method, or a modified method thereof. In the impregnation, usually, the preform is generally preheated as a preliminary step to enhance the permeation of the aluminum alloy. In the preheating treatment, it should be noted that the oxygen content does not exceed 1.4 mass % by oxidization of the silicon carbide particles constituting the preform, and it is further preferred to suppress the oxygen content to 1.1 mass % or less.

The aluminum-silicon-carbide composite according to the above-described embodiment has a high thermal conductivity of 230 W/mK or more and is therefore preferred as a heat sink material for a power module. In addition, since the coefficient of thermal expansion at 25° C. to 150° C. is 7.0 ppm/K or less, the aluminum-silicon-carbide composite can be used as a semiconductor module radiator plate.

The aluminum-silicon-carbide composite according to the above-described embodiment has low specific gravity of about 3 and is also useful as a mounting material for a moving apparatus, such as a car and a train.

EXAMPLES

Example 1

Weighed were 65 mass % of a silicon carbide powder having a particle diameter of 80-800 μm, 25 mass % of a silicon carbide powder having a particle diameter of 8 μm or more and less than 80 μm, 10 mass % of a silicon carbide powder having a particle diameter of less than 8 μm, 8.9 mass % of colloidal silica (Snowtex O manufactured by Nissan Chemical Industries, Ltd., containing 20 mass % of solid content), and 12 mass % of water, which were mixed to prepare a slurry. This slurry was poured into a plaster mold and was left to stand and was then demolded and dried to obtain a molded body. This molded body was fired in air at 1000° C. for 4 hours into a preform.

As the silicon carbide powder having a particle diameter of 80-800 μm, NG-F80 manufactured by Pacific Rundum Co., Ltd. was used.

As the silicon carbide powder having a particle diameter of 8 μm or more and less than 80 μm in an amount of 25 mass % and the silicon carbide powder having a particle diameter of less than 8 μm in an amount of 10 mass %, a powder prepared by mixing GC-#500 manufactured by Nanko Abrasives Industry Co., Ltd., GC-1000F manufactured by Yakushima Denko Co., Ltd., and GC-#4000 manufactured by Nanko Abrasives Industry Co., Ltd. at a blending ratio of 13.5:16.5:5.0 was used.

A part of the preform was processed into a diameter of 50 mm and a thickness of 5 mm for measuring the density. The filling degree of silicon carbide of the preform was 69.6%. The filling degree of silicon carbide of the preform was defined as the percentage obtained by dividing the density of the processed product by the theoretical density 3.21 g/cm$^3$ of silicon carbide.

The residual preform was preheated by being fired in air at 650° C. for 1 hour. The preform was set in a mold immediately after the preheating, and an aluminum alloy containing 12 mass % of silicon and 1 mass % of magnesium and molten at 850° C. was input into the mold so as to sufficiently cover the front surface of the preform. Subsequently, pressing was promptly performed with a punch at a pressure of 56 MPa for 14 minutes. After cooling, the aluminum alloy lump containing a silicon carbide composite was taken out from the mold. The silicon carbide composite was further cut out from the lump.

In order to measure the thermal conductivity at the room temperature, a part of the composite was processed into a sample having a length of 25 mm, a width of 25 mm, and a thickness of 1 mm. The thermal conductivity of this sample was measured by a laser flash method and was 252 W/mK. The sample for measuring the coefficient of thermal expansion was cut out from the composite into a predetermined shape, and the coefficient of thermal expansion was measured from room temperature (25° C.) to 150° C. The results are shown in Table 1.

TABLE 1

| | Silicon carbide powder quantity (mass %) | | | | | Filling degree (vol %) | Al alloy composition (mass %) | | Thermal conductivity (W/mK) | Coefficient of thermal expansion (ppm/K) |
|---|---|---|---|---|---|---|---|---|---|---|
| | 80-800 μm | 8 μm or more and less than 80 μm | Less than 8 μm | Binder | Binder quantity (mass %) | | Si | Mg | | |
| Example 1 | 65 | 25 | 10 | Colloidal silica | 8.9 | 69.6 | 12 | 0.9 | 252 | 6.2 |
| Example 2 | 65 | 26 | 9 | Colloidal silica | 11.6 | 67.9 | 12 | 0.9 | 231 | 6.3 |
| Example 3 | 65 | 25 | 10 | Colloidal silica | 12 | 67.6 | 12 | 0.9 | 232 | 6.4 |
| Example 4 | 65 | 25 | 10 | Colloidal silica | 12 | 66.9 | 12 | 1.2 | 233 | 6.3 |
| Example 5 | 65 | 25 | 10 | Colloidal silica | 12 | 67 | 12 | 1.6 | 251 | 6.3 |
| Example 6 | 65 | 25 | 10 | Colloidal silica | 6 | 69 | 12 | 0.9 | 246 | 6.4 |
| Example 7 | 60 | 30 | 10 | Colloidal silica | 12 | 65 | 12 | 0.9 | 245 | 6.7 |
| Example 8 | 75 | 20 | 5 | Colloidal silica | 12 | 62 | 12 | 0.9 | 251 | 6.9 |
| Example 9 | 70 | 20 | 10 | Colloidal silica | 12 | 62 | 12 | 1.6 | 246 | 6.9 |
| Example 10 | 70 | 20 | 10 | Colloidal silica | 12 | 62 | 12 | 2.1 | 242 | 6.9 |
| Comparative Example | 55 | 40 | 5 | Colloidal silica | 12 | 65 | 12 | 0.9 | 200 | 7.5 |

Example 2

Weighed were 65 mass % of a silicon carbide powder having a particle diameter of 80 μm or more and 800 μm or less, 26 mass % of a silicon carbide powder having a particle diameter of 8 μm or more and less than 80 μm, 9 mass % of a silicon carbide powder having a particle diameter of less than 8 μm, 11.6 mass % of colloidal silica (Snowtex O manufactured by Nissan Chemical Industries, Ltd., containing 20 mass % of solid content), and 9 mass % of water, which were mixed to prepare a slurry.

As the silicon carbide powder having a particle diameter of 80 μm or more and 800 μm or less, NG-F80 manufactured by Pacific Rundum Co., Ltd. was used.

As the silicon carbide powder having a particle diameter of 8 μm or more and less than 80 μm in an amount of 26 mass % and the silicon carbide powder having a particle diameter of less than 8 μm in an amount of 9 mass %, a powder prepared by mixing GC-#500 manufactured by Nanko Abrasives Industry Co., Ltd. and GC-1000F and GMF-4S manufactured by Yakushima Denko Co., Ltd. at a blending ratio of 13.5:16.5:5.0 was used.

A preform and a composite were produced as in Example 1. The results are shown in Table 1.

Example 3

Weighed were 65 mass % of a silicon carbide powder having a particle diameter of 80 μm or more and 800 μm or less, 25 mass % of a silicon carbide powder having a particle diameter of 8 μm or more and less than 80 μm, 10 mass % of a silicon carbide powder having a particle diameter of less than 8 μm, 12.0 mass % of colloidal silica (Snowtex O manufactured by Nissan Chemical Industries, Ltd., containing 20 mass % of solid content), and 9 mass % of water, which were mixed to prepare a slurry.

As the silicon carbide powder having a particle diameter of 80 μm or more and 800 μm or less, NG-F80 manufactured by Pacific Rundum Co., Ltd. was used.

As the silicon carbide powder having a particle diameter of 8 μm or more and less than 80 μm in an amount of 25 mass % and the silicon carbide powder having a particle diameter of less than 8 μm in an amount of 10 mass %, a powder prepared by mixing GC-#500 manufactured by Nanko Abrasives Industry Co., Ltd., GC-1000F manufactured by Yakushima Denko Co., Ltd., and GC-#4000 manufactured by Nanko Abrasives Industry Co., Ltd. at a blending ratio of 13.5:16.5:5.0 was used. A preform was produced as in Example 1.

A composite was produced using an aluminum alloy containing 12 mass % of silica and 0.9 mass % of magnesium. The results are shown in Table 1.

Example 4

A preform and a composite were produced as in Example 3 except that an aluminum alloy containing 12 mass % of silicon and 1.2 mass % of magnesium was used. The results are shown in Table 1.

Example 5

A preform and a composite were produced as in Example 3 except that an aluminum alloy containing 12 mass % of silicon and 1.6 mass % of magnesium was used. The results are shown in Table 1.

Example 6

As the silicon carbide powder having a particle diameter of 80 μm or more and 800 μm or less, NG-F80 manufactured by Pacific Rundum Co., Ltd. was used.

As the silicon carbide powder having a particle diameter of 8 μm or more and less than 80 μm in an amount of 25 mass % and the silicon carbide powder having a particle diameter of less than 8 μm in an amount of 10 mass %, a powder prepared by mixing GC-#500 manufactured by Nanko Abrasives Industry Co., Ltd., GC-1000F manufactured by Yakushima Denko Co., Ltd., and GC-#6000 manufactured by Nanko Abrasives Industry Co., Ltd. at a blending ratio of 13.5:16.5:5.0 was used.

A preform and a composite were produced as in Example 3 except that 6 mass % of colloidal silica (Snowtex O manufactured by Nissan Chemical Industries, Ltd., containing 20 mass % of solid content) was weighed, and a slurry was prepared. The results are shown in Table 1.

Example 7

Weighed were 60 mass % of a silicon carbide powder having a particle diameter of 80 μm or more and 800 μm or less, 30 mass % of a silicon carbide powder having a particle diameter of 8 μm or more and less than 80 μm, 10 mass % of a silicon carbide powder having a particle diameter of less than 8 μm, 12 mass % of colloidal silica (Snowtex O manufactured by Nissan Chemical Industries, Ltd., containing 20 mass % of solid content), and 9 mass % of water, which were mixed to prepare a slurry.

As the silicon carbide powder having a particle diameter of 80 μm or more and 800 μm or less in an amount of 60 mass %, the silicon carbide powder having a particle diameter of 8 μm or more and less than 80 μm in an amount of 30 mass %, and the silicon carbide powder having a particle diameter of less than 8 μm in an amount of 10 mass %, a powder prepared by mixing NG-F54 manufactured by Pacific Rundum Co., Ltd., GC-#500 manufactured by Pacific Rundum Co., Ltd., and GC-#3000 manufactured by Pacific Rundum Co., Ltd. at a blending ratio of 60:30:10 was used.

A preform and a composite were produced as in Example 1. The results are shown in Table 1.

Example 8

Weighed were 75 mass % of a silicon carbide powder having a particle diameter of 80 μm or more and 800 μm or less, 25 mass % of a silicon carbide powder having a particle diameter of 8 μm or more and less than 80 μm, 5 mass % of a silicon carbide powder having a particle diameter of less than 8 μm, 12 mass % of colloidal silica (Snowtex O manufactured by Nissan Chemical Industries, Ltd., containing 20 mass % of solid content), and 9 mass % of water, which were mixed to prepare a slurry.

As the silicon carbide powder having a particle diameter of 80 μm or more and 800 μm or less in an amount of 75 mass %, the silicon carbide powder having a particle diameter of 8 μm or more and less than 80 μm in an amount of 20 mass %, and the silicon carbide powder having a particle diameter of less than 8 μm in an amount of 5 mass %, a powder prepared by mixing NG-F30 manufactured by Pacific Rundum Co., Ltd., NG-F220 manufactured by Pacific Rundum Co., Ltd., and GC-#2000 manufactured by Pacific Rundum Co., Ltd. at a blending ratio of 60:30:10 was used.

A preform and a composite were produced as in Example 1. The results are shown in Table 1.

Example 9

Weighed were 70 mass % of a silicon carbide powder having a particle diameter of 80 μm or more and 800 μm or less, 20 mass % of a silicon carbide powder having a particle diameter of 8 μm or more and less than 80 μm, 10 mass % of a silicon carbide powder having a particle diameter of less than 8 μm, 12 mass % of colloidal silica (Snowtex O manufactured by Nissan Chemical Industries, Ltd., containing 20 mass % of solid content), and 9 mass % of water, which were mixed to prepare a slurry.

As the silicon carbide powder having a particle diameter of 80 μm or more and 800 μm or less, NG-F80 manufactured by Pacific Rundum Co., Ltd. was used.

As the silicon carbide powder having a particle diameter of 8 μm or more and less than 80 μm in an amount of 20 mass % and the silicon carbide powder having a particle diameter of less than 8 μm in an amount of 10 mass %, a powder prepared by mixing GC-#800 manufactured by Pacific Rundum Co., Ltd. and GC-#6000 manufactured by Pacific Rundum Co., Ltd. at a blending ratio of 20:10 was used.

A preform was produced as in Example 1. The aluminum alloy contained 12 mass % of silicon and 1.6 mass % of magnesium.

Example 10

A preform and a composite were produced as in Example 9 except that an aluminum alloy containing 12 mass % of silicon and 2.1 mass % of magnesium was used.

Comparative Example

Weighed were 55 mass % of a silicon carbide powder having a particle diameter of 80 μm or more and 800 μm or less, 40 mass % of a silicon carbide powder having a particle diameter of 8 μm or more and less than 80 μm, 5 mass % of a silicon carbide powder having a particle diameter of less than 8 μm, 12 mass % of colloidal silica (Snowtex O manufactured by Nissan Chemical Industries, Ltd., containing 20 mass % of solid content), and 12 mass % of water, which were mixed to prepare a slurry. This slurry was poured into a plaster mold and was left to stand and was then demolded and dried to obtain a molded body. This molded body was fired in air at 1000° C. for 4 hours into a preform.

As the silicon carbide powder having a particle diameter of 80 μm or more and 800 μm or less in an amount of 55 mass %, the silicon carbide powder having a particle diameter of 8 μm or more and less than 80 μm in an amount of 40 mass %, and the silicon carbide powder having a particle diameter of less than 8 μm in an amount of 5 mass %, a powder prepared by mixing NG-F150 manufactured by Pacific Rundum Co., Ltd. and GC-1000F manufactured by Yakushima Denko Co., Ltd. at a blending ratio of 2:1 was used.

As obvious from Table 1, the aluminum-silicon-carbide composites of Examples 1 to 10 according to the present invention each have high thermal conductivity and a low coefficient of thermal expansion. It is also demonstrated that these aluminum-silicon-carbide composites each have low specific gravity.

Thus, the aluminum-silicon-carbide composite according to the present invention is preferred as a heat sink material for a power module because of its high thermal conductivity, can be used as a semiconductor module radiator plate because of its low coefficient of thermal expansion, and is also useful as a mounting material for a moving apparatus, such as a car and a train, because of its low specific gravity.

The invention claimed is:

1. An aluminum-silicon-carbide composite formed by impregnating a porous silicon carbide molded body with an aluminum alloy, wherein
   a ratio of the silicon carbide in the composite is 60 vol % or more; and
   the composite contains:
      60-75 mass % of silicon carbide having a particle diameter of 80 μm or more and 800 μm or less;
      20-30 mass % of silicon carbide having a particle diameter of 8 μm or more and less than 80 μm; and
      5-10 mass % of silicon carbide having a particle diameter of less than 8 μm,
   wherein the aluminum-silicon-carbide composite has a thermal conductivity of 230 W/mK or more at 25° C.

2. The aluminum-silicon-carbide composite according to claim 1, having a coefficient of thermal expansion of 7.0 ppm/K or less at 25° C. to 150° C.

3. The aluminum-silicon-carbide composite according to claim 1, wherein the aluminum alloy contains 10 to 14 mass % of silicon and 0.5 to 2.5 mass % of magnesium.

4. The aluminum-silicon-carbide composite according to claim 2, wherein the aluminum alloy contains 10 to 14 mass % of silicon and 0.5 to 2.5 mass % of magnesium.

* * * * *